(12) United States Patent
Salminen et al.

(10) Patent No.: US 7,820,125 B2
(45) Date of Patent: Oct. 26, 2010

(54) PHOSPHORUS EFFUSION CELL ARRANGEMENT AND METHOD FOR PRODUCING MOLECULAR PHOSPHORUS

(75) Inventors: Lasse Salminen, Masku (FI); Esa Supponen, Loimaa (FI); Jari Vanhatalo, Nastringues (FR)

(73) Assignee: DCA Instruments Oy, Turku (FI)

( * ) Notice: Subject to any disclaimer, the term of this patent is extended or adjusted under 35 U.S.C. 154(b) by 747 days.

(21) Appl. No.: 11/629,993

(22) PCT Filed: Jun. 30, 2004

(86) PCT No.: PCT/FI2004/000405

§ 371 (c)(1),
(2), (4) Date: Dec. 19, 2006

(87) PCT Pub. No.: WO2006/003231

PCT Pub. Date: Jan. 12, 2006

(65) Prior Publication Data

US 2008/0019897 A1    Jan. 24, 2008

(51) Int. Cl.
*C01B 25/02* (2006.01)
*B01J 8/04* (2006.01)
*B01D 5/00* (2006.01)
*B01D 7/00* (2006.01)

(52) U.S. Cl. .................. 423/322; 118/719; 422/189; 422/199; 422/244

(58) Field of Classification Search ............... 422/188, 422/189, 199, 244; 423/299, 322, 508, 509, 423/510, 511, 561.1, 567.1; 118/719, 726, 118/724, 725, 727; 117/84, 105, 106, 108, 117/109; 392/386, 387, 389
See application file for complete search history.

(56) References Cited

U.S. PATENT DOCUMENTS

| | | | | |
|---|---|---|---|---|
| 4,681,773 | A | * | 7/1987 | Bean ................... 427/255.5 |
| 5,431,735 | A | | 7/1995 | Briones |
| 5,482,892 | A | | 1/1996 | Briones |
| 6,030,458 | A | | 2/2000 | Colombo et al. |
| 7,381,383 | B1 | * | 6/2008 | Yokoyama et al. ......... 422/198 |

OTHER PUBLICATIONS

Pessa et al, "All-solid-source molecular beam epitaxy for growth of III-V compound semiconductors", Thin Solid Films, Elsevier-Sequoia S.A., Lausanne, CH, vol. 306, No. 2, Sep. 11, 1997, pp. 237-243.

* cited by examiner

*Primary Examiner*—Wayne Langel
*Assistant Examiner*—Brittany M Martinez
(74) *Attorney, Agent, or Firm*—Nixon & Vanderhye P.C.

(57) ABSTRACT

The phosphorus effusion cell arrangement according to the present invention comprises a first vacuum container for red phosphorus, a second vacuum container for white phosphorus, said first and second vacuum containers being interconnected, means for providing vacuum, a thermal cracker in connection with said second vacuum container, as well as a control valve between said second vacuum container and said thermal cracker. The present invention is characterized in that it further comprises a separating valve between said first and second vacuum containers, provided that there is no direct connection between said first vacuum container and said thermal cracker. The invention also relates to a method for producing molecular phosphorus $P_2$.

10 Claims, 2 Drawing Sheets

PHOSPHORUS EFFUSION CELL ARRANGEMENT AND METHOD FOR PRODUCING MOLECULAR PHOSPHORUS

This application is the U.S. national phase of international application PCT/FI2004/000405 filed Jun. 30, 2004 which designated the U.S., the entire content of which is hereby incorporated by reference.

FIELD OF THE INVENTION

The present invention relates to a phosphorus effusion cell arrangement comprising a first vacuum container for red phosphorus, a second vacuum container for white phosphorus, said first and second vacuum containers being interconnected, means for providing vacuum, a thermal cracker in connection with said second vacuum container, as well as a control valve between said second vacuum container and said thermal cracker.

The invention also relates to a method for producing molecular phosphorus $P_2$, said method comprising sublimating red phosphorus in a first vacuum container, directing said sublimated red phosphorus to a second vacuum container, cooling said second vacuum container to condense said sublimated red phosphorus in order to produce white phosphorus, heating said second vacuum container to sublimate said white phosphorus in said second vacuum container, directing said sublimated white phosphorus to a thermal cracker and thermally cracking said sublimated white phosphorus to phosphorus $P_2$.

BACKGROUND OF THE INVENTION

In this description, the terms "P red" and "red phosphorus" may be used interchangeably. Also the terms "P white" and "white phosphorus" may be used interchangeably.

A phosphorus effusion cell is used for generating a molecular beam of phosphorus ($P_2$) in a molecular beam epitaxy (MBE) reactor. The cell uses red phosphorus (P-red) as the source material. The P-red is first converted into white phosphorus (P-white). The P-white is then heated to produce phosphorus ($P_4$), which is directed through a control valve to a thermal cracker. The thermal cracker cracks $P_4$ molecules into $P_2$ molecules. The use of $P_2$ instead of $P_4$ for the growth of indium phosphide and related materials is advantageous because of two reasons, namely material quality and safety. A control valve between the white phosphorus container and the thermal cracker is used to control the $P_2$ flux.

The phosphorus charge used in MBE is in the form of solid red phosphorus. In this description, P-red means red allotrope of phosphorus and P-white means white allotrope of phosphorus.

As is well known in the art, when P-red is heated in vacuum to over 300° C. it creates (by sublimation) $P_4$ molecules. The $P_4$ pressure of P-red at 300° C. is 8.5 mbar and the $P_2$ pressure of P-red at 300° C. is less than $4 \times 10^{-5}$ mbar. Therefore practically all phosphorus sublimated from P-red is in $P_4$ molecular form. When $P_4$ is condensed on a colder surface it will condense as P-white and the P-white pressure at 300° C. is very high, about 1000 mbar. Further, the $P_4$ molecules can be thermally cracked to $P_2$ and when $P_2$ condenses on cold surface it will condense as P-red. It is also known that P-white is highly flammable at room temperature and therefore the devices are to be kept under vacuum.

Several different arrangements are known for phosphorus effusion sources. For example, in the patent U.S. Pat. No. 5,431,735 a device is proposed, that comprises a vessel in which vapour of phosphorus is produced from red phosphorus (P-red). The vessel consists of two concentric zones having different temperatures. One zone is used for sublimation of P-red and the other for condensation and re-evaporation of P-white. P-red is continuously heated during operation and P-white is continuously condensed into said condenser zone. The phosphorus flows continuously from the P-red container, through the P-white container and further to the thermal cracker. In this device, the P-red source material must be continuously heated during operation in order to maintain the flow from P-red to P-white and further to the thermal cracker.

The patent U.S. Pat. No. 6,030,458 discloses a device in which the P-red and P-white containers are enclosed by a vacuum jacket. The two containers are connected to each other with a tube. The device is operated in a mode where P-red is first converted into P-white and after conversion P-white is evaporated to form $P_4$. After conversion the P-red container is kept at an elevated temperature to prevent re-condensation of phosphorus into the P-red container. In this device, P-red must be continuously heated in order to prevent re-condensation of $P_4$ into the P-red container.

The Applicants have further found that the prior art devices have also the following problems.

In prior art devices the two containers are physically connected, and therefore it is difficult to achieve stable $P_4$ pressure while two different temperature zones are connected to each other. Thus, a change in one container temperature will affect the temperature in the other container.

On the other hand, production scale MBE systems require large capacity P-red charges to be used in order to increase the time interval between the system source fillings, which normally requires venting of the MBE growth chamber. As in both above-mentioned devices the P-red charge must be kept continuously at elevated temperatures, the response time to temperature changes becomes very long due to the large thermal mass of the P-red charge.

Moreover, as described in the patent U.S. Pat. No. 5,431,735, any internal hot part in the effusion cell can cause thermal cracking of $P_4$ into $P_2$ inside the cell. Typically, the P-red heater element must be run at a higher temperature than the desired P-red temperature because of thermal leaks. This results in a small fraction of $P_4$ to crack into $P_2$ in the heater element or on the hot walls of the P-red container before the $P_4$ flux reaches the cracker zone. Because $P_2$ condenses as P-red, some condensation of P-red occurs inside the effusion cell in the prior art devices. Over time this results in accumulation of red phosphorus deposits inside the P-white container. This has a detrimental effect on the film quality and the thermal behaviour of the P-white container.

Last but not least, in the both prior art devices described above, the P-white container is exposed to air during source refilling with P-red. This may be detrimental to the purity of the grown epitaxial layers as well as to safety, as P-white is highly flammable at room temperature.

OBJECTS AND SUMMARY OF THE INVENTION

An object of the present invention is to provide an arrangement for thermal cracking of phosphorus that does not have the above drawbacks. An object of the present invention is thus to provide an apparatus and a method that allow the efficient and safe production of constant, high quality molecular phosphorus. Another object of the present invention is to provide an apparatus and method for producing molecular phosphorus in which there are no or minimal risks of deposition of P-red inside the P-white container. It is also an object of this invention to provide an apparatus and method for producing molecular phosphorus that does not require long periods of time in order to be operational.

The phosphorus effusion cell arrangement according to the present invention comprises a first vacuum container for red phosphorus, a second vacuum container for white phosphorus, said first and second vacuum containers being interconnected, means for providing vacuum, a thermal cracker in connection with said second vacuum container, as well as a control valve between said second vacuum container and said thermal cracker. The present invention is characterized in that it further comprises a separating valve between said first and second vacuum containers, provided that there is no direct connection between said first vacuum container and said thermal cracker.

The invention also relates to a method for producing molecular phosphorus $P_2$, said method comprising sublimating red phosphorus in a first vacuum container, directing said sublimated red phosphorus to a second vacuum container, cooling said second vacuum container to condense said sublimated red phosphorus in order to produce white phosphorus, heating said second vacuum container to sublimate said white phosphorus in said second vacuum container, directing said sublimated white phosphorus to a thermal cracker and thermally cracking said sublimated white phosphorus to phosphorus $P_2$. The method according to the invention is characterized in that during the heating of said second vacuum container the connection between said first and second vacuum containers is closed.

DETAILED DESCRIPTION OF THE INVENTION

The present invention relates to a phosphorus effusion cell arrangement, i.e. to an apparatus for sublimating and cracking phosphorus.

The phosphorus effusion cell arrangement according to the present invention comprises a first vacuum container for red phosphorus, a second vacuum container for white phosphorus, said first and second vacuum containers being interconnected, means for providing vacuum, a thermal cracker in connection with said second vacuum container, as well as a control valve between said second vacuum container and said thermal cracker. The present invention is characterized in that it further comprises a separating valve between said first and second vacuum containers, provided that there is no direct connection between said first vacuum container and said thermal cracker.

The phosphorus effusion cell arrangement according to the present invention thus comprises the following main parts:

The phosphorus effusion cell arrangement comprises a first vacuum container that has a valve, which allows the container to be evacuated by a vacuum pump. The first vacuum container, i.e. the P-red container typically also has means for heating it, such as an internal heater, which is used to heat P-red to sublimate it. The typical P-red temperature during P-red to P-white conversion is 350° C. According to the present invention, the first vacuum container has a second valve, which separates it from a second vacuum container used for condensing the sublimated P-red.

The second vacuum container, i.e. the P-white vacuum container is used for two purposes and therefore, according to an embodiment of the invention, comprises means for heating and cooling, such as a heater/cooler. First, during P-red to P-white conversion, the second vacuum container is cooled to below 30° C. to condense the sublimated P-red. After a completed conversion of P-red to P-white the valve between the two vacuum containers is closed. The second purpose of the second, P-white vacuum container is to create high enough $P_4$ so that an adequate flow of $P_4$ can be created through the control valve to the thermal cracker zone. Therefore, the heater/cooler of said second vacuum container is used to cool the container to below 30° C. during P-red to P-white conversion and to heat the container to 50° C. during the growth process.

According to an embodiment of the invention, the means for providing vacuum in the first vacuum container are also used for providing vacuum in the second vacuum container. The second vacuum container may naturally also comprise independent means for providing vacuum. The second vacuum container, said P-white vacuum container is may also be surrounded with a vacuum jacket.

In this description, the terms "first vacuum container" and "P-red vacuum container" may be used interchangeably. Also the terms "second vacuum container" and "P-white vacuum container" may be used interchangeably.

The separating valve between the P-red and P-white vacuum containers allows the P-red container to be closed off from the P-white container with a vacuum tight seal.

The arrangement further comprises a control valve between the P-white container and the thermal cracker. This valve is a control valve with variable conductance. The valve is used to regulate the flow of $P_4$ into the thermal cracker. The thermal cracker zone typically comprises a heater, which thermally dissociates $P_4$ molecules into $P_2$ molecules.

The control valve is preferably kept around 80-100° C. to prevent white phosphorus condensation in the valve. This can be done by using an insulated heating jacket wrapped around the valve body, or by any another means known per se.

The valve between the red phosphorus container and the white phosphorus container is also preferably kept at around 80-100° C. to prevent white phosphorus condensation in the valve. This valve is preferably kept hot also when the valve is closed and the red phosphorus tank is removed. The separating valve between the red and white phosphorus containers may also be heated using an insulated heater jacket wrapped around the valve body, or by any other means known per se.

The present invention solves the problems encountered in the prior art devices and thus fulfils the objects listed above. Indeed, in the present invention, only one container temperature needs to be regulated during growth (P-white). This improves the temperature stability of the P-white container and thereby the stability of the phosphorus flux. On the other hand, it has been found that in order to provide a constant flux from the effusion cell, it is important that both the P-red and P-white container temperatures are regulated very carefully and accurately, which is possible with the present invention, since these two containers can be closed off from each other.

Also, according to an embodiment of the present invention, the P-red tank can be removed from the phosphorus effusion cell without interrupting the growth process. The P-white container can be used for phosphorus evaporation even when the P-red tank is disconnected for source for P-red refilling. Also smaller P-red charges can be used even for production MBE use. This means that the P-red temperature can be set for P-red to P-white conversion within short stabilization times unlike in the previous devices. The stabilization time needed in the present invention is in the order of few hours.

Moreover, in the present invention the accumulation of red phosphorus deposits inside the P-white container is eliminated as the P-red tank is only heated during P-red to P-white conversion. During the growth it is closed off with the separating valve and can be cooled down. Therefore, there is no detrimental effect on the film quality and thermal behaviour of the P-white container.

Furthermore, in the present invention, the P-white container can be kept under ultra high vacuum (UHV) conditions indefinitely, i.e. during the total service life of the arrangement or of said second vacuum container This improves the purity of the grown epitaxial layers as the internal surfaces of the P-white container are not exposed to air and moisture during source refilling. This also improves safety, as any residual P-white in the P-white container is never exposed to air.

A further advantage of the present invention is that the capacity of the arrangement may be easily adjusted, since different amounts of P-red may be used, as described above.

According to an embodiment of the present invention, the P-red container can be removed from the phosphorus effusion cell without venting the MBE chamber or venting the P-white container. The P-red container can be removed from the effusion cell for example for refilling or cleaning while the cell is used for growth.

According to an embodiment of the present invention, means for providing vacuum are needed only in the P-red container. The means for providing vacuum are any means known per se, such as a vacuum pump.

Furthermore, the means for heating and/or cooling the vacuum containers are any means known per se, such as heater filaments or liquid or gas circulation arrangements. Also, the thermal cracker used in the present invention is any thermal cracker known to a person skilled in the art.

The invention also relates to a method for producing molecular phosphorus $P_2$, said method comprising sublimating red phosphorus in a first vacuum container, directing said sublimated red phosphorus to a second vacuum container, cooling said second vacuum container to condense said sublimated red phosphorus in order to produce white phosphorus, heating said second vacuum container to sublimate said white phosphorus in said second vacuum container, directing said sublimated white phosphorus to a thermal cracker and thermally cracking said sublimated white phosphorus to phosphorus $P_2$. The method according to the invention is characterized in that during the heating of said second vacuum container the connection between said first and second vacuum containers is closed.

According to the present invention, the flow of the sublimated white phosphorus from said second vacuum container to said first vacuum container is thus prevented.

According to an embodiment of the present invention, said first vacuum container is detached from said second vacuum container during the heating of said second vacuum container.

According to another embodiment of the present invention, said first vacuum container is refilled during at least part of the heating of said second vacuum container. According to yet another embodiment of the present invention, said second vacuum container is under vacuum during essentially whole of its service life.

It is clear that also all the other details and embodiments described above in connection with the arrangement may be used in the present method.

DETAILED DESCRIPTION OF THE DRAWING

Figure 1:
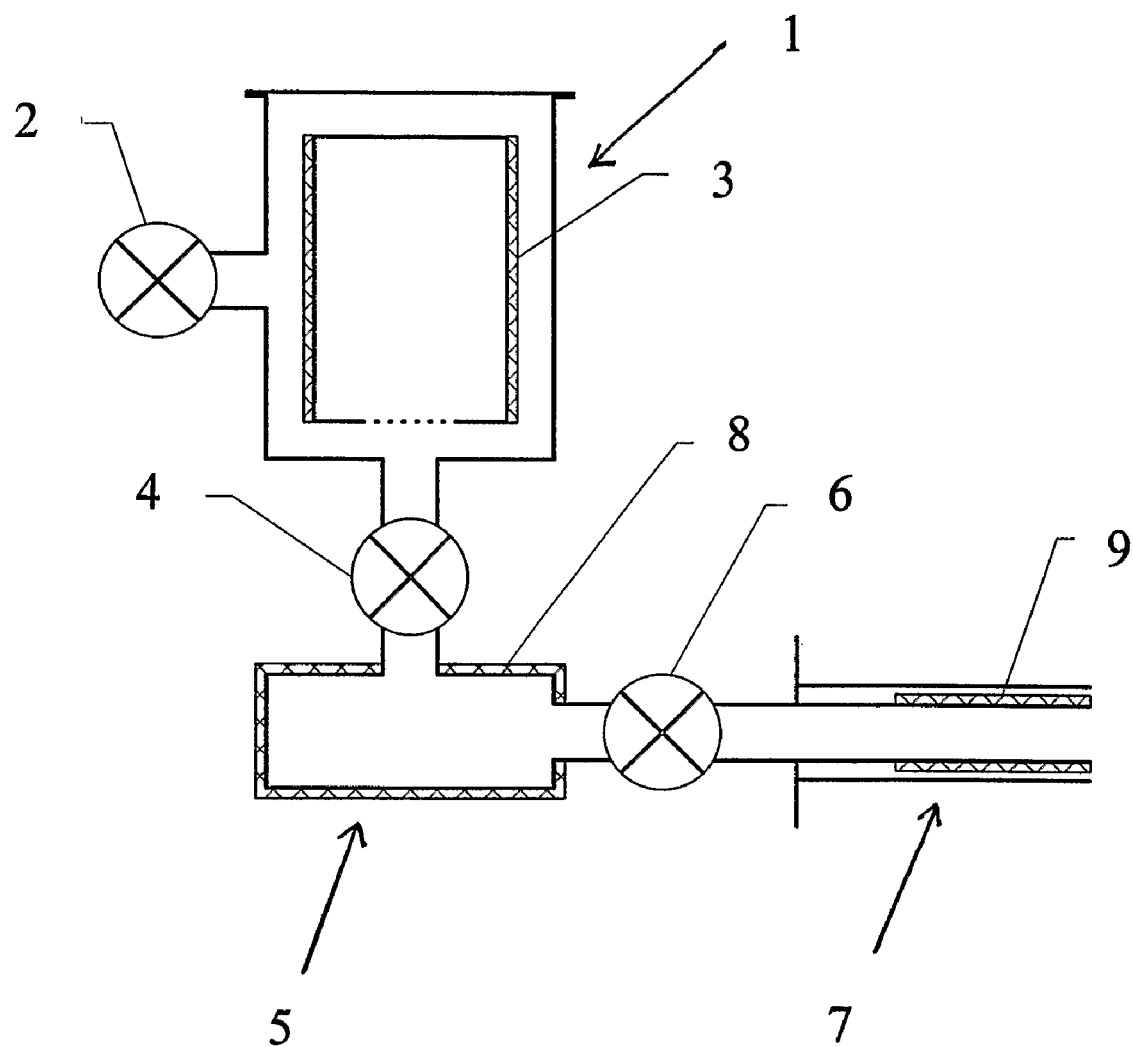
FIG. 1 illustrates schematically a first embodiment of the invention.

FIG. 1 illustrates schematically a first embodiment of the invention. The Figure shows a vacuum container 1 for P-red. The P-red container 1 has a valve 2, which allows the P-red container 1 to be evacuated by a vacuum pump (not shown). The P-red container 1 has an internal heater 3, which is used to heat P-red to evaporate it by sublimation. The typical P-red temperature during P-red to P-white conversion is 350° C. The P-red container 1 has a second valve 4, which separates it from a P-white container 5 used for condensing the evaporated P-red, that is, a vacuum container 5 for P-white. The P-white container 5 is used for two purposes. First, during P-red to P-white conversion, the P-white container 5 is cooled to below 30° C. to condense the evaporated P-red. After the P-red to P-white conversion is completed, the valve 4 is closed. The second purpose of the P-white container 5 is to create high enough $P_4$ pressure in said P-white container 5 so that an adequate flow of $P_4$ can be created through the control valve 6 to the thermal cracker zone 7. The heater/cooler 8 is used to cool the P-white container 5 to below 30° C. during the red-to-white conversion and to heat the P-white container 5 to 50° C. during the growth of process.

The valve 4 allows the P-red container 1 to be closed off from the P-white container 5 with a vacuum tight seal. The valve 6 is a control valve with variable conductance. The valve 6 is used to regulate the flow of $P_4$ through it and into the thermal cracker 7. The thermal cracker 7 with heater 9 thermally dissociates $P_4$ molecules into $P_2$ molecules.

Figure 2:
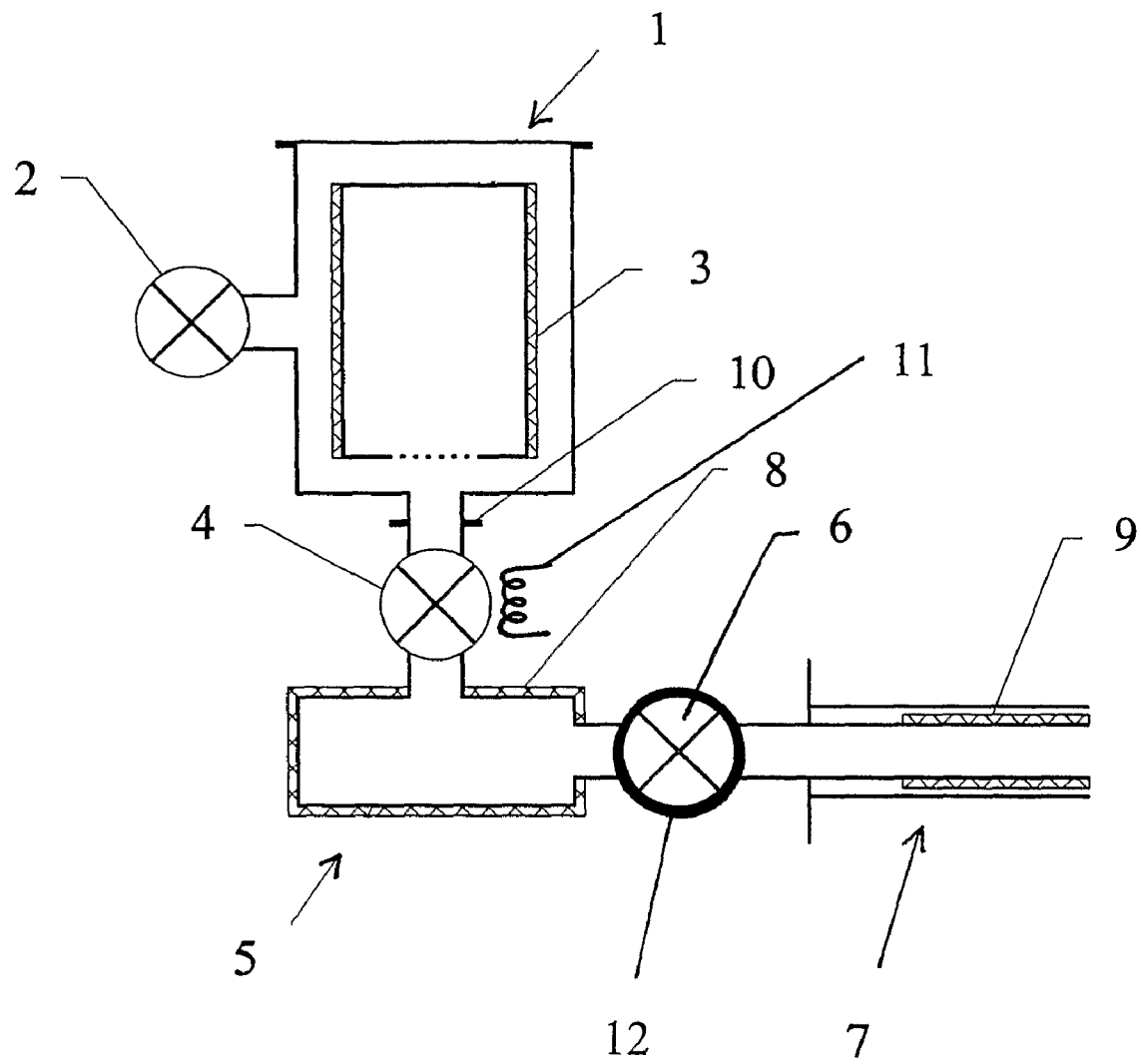
FIG. 2 illustrates schematically a second embodiment of the invention.

FIG. 2 illustrates schematically a second embodiment of the invention. This embodiment differs from the embodiment of FIG. 1 in that it further comprises a flange pair 10 that allows the removal of the P-red container 1 from the effusion cell for refilling or cleaning while the cell is used for growth. In this embodiment, the arrangement also comprises means 11 for heating the separating valve 4 as well as means 12 for heating the control valve 6.

The invention claimed is:

1. A phosphorus effusion cell arrangement comprising:
   a first vacuum container for red phosphorus,
   a second vacuum container for white phosphorus, said first and second vacuum containers being interconnected,
   means for providing vacuum,
   a thermal cracker in connection with said second vacuum container,
   a control valve between said second vacuum container and said thermal cracker and
   a separating valve between said first and second vacuum containers, and wherein there is no direct connection between said first vacuum container and said thermal cracker.

2. A phosphorus effusion cell arrangement according to claim 1, wherein said first vacuum container is arranged to be detachable from said separating valve.

3. A phosphorus effusion cell arrangement according to claim 1, wherein said means for providing vacuum are in connection with said first vacuum container.

4. A phosphorus effusion cell arrangement according to claim 1, further comprising means for heating and cooling said second vacuum container.

5. A phosphorus effusion cell arrangement according to claim 1, further comprising means for heating said separating valve.

6. A phosphorus effusion cell arrangement according to claim 1, further comprising means for heating said control valve.

7. A method for producing molecular phosphorus $P_2$ comprising:
   sublimating red phosphorus in a first vacuum container,
   directing said sublimated red phosphorus to a second vacuum container, cooling said second vacuum container to condense said sublimated red phosphorus in order to produce white phosphorus, heating said second vacuum container to sublimate said white phosphorus in said second vacuum container, directing said sublimated white phosphorus to a thermal cracker, and thermally cracking said sublimated white phosphorus to phosphorus $P_2$, wherein during the heating of said second vacuum container the connection between said first and second vacuum containers is closed.

8. A method for producing molecular phosphorus $P_2$ according to claim 7, wherein during the heating of said second vacuum container said first vacuum container is detached from said second vacuum container.

9. A method for producing molecular phosphorus $P_2$ according to claim 7, wherein during at least part of the heating of said second vacuum container said first vacuum container is refilled.

10. A method for producing molecular phosphorus $P_2$ according to claim 7, wherein said second vacuum container is under vacuum during essentially whole of the service life of said second vacuum container.

* * * * *